US012006096B2

(12) United States Patent
Watanabe et al.

(10) Patent No.: US 12,006,096 B2
(45) Date of Patent: Jun. 11, 2024

(54) BETA-DIKETONE STORAGE CONTAINER AND PACKAGING METHOD

(71) Applicant: Central Glass Company, Limited, Ube (JP)

(72) Inventors: Kenta Watanabe, Ube (JP); Takashi Masuda, Ube (JP); Kazuki Tanaka, Ube (JP)

(73) Assignee: CENTRAL GLASS COMPANY, LIMITED

( * ) Notice: Subject to any disclaimer, the term of this patent is extended or adjusted under 35 U.S.C. 154(b) by 287 days.

(21) Appl. No.: 17/595,627

(22) PCT Filed: Apr. 22, 2020

(86) PCT No.: PCT/JP2020/017308
§ 371 (c)(1),
(2) Date: Nov. 19, 2021

(87) PCT Pub. No.: WO2020/241128
PCT Pub. Date: Dec. 3, 2020

(65) Prior Publication Data
US 2022/0227531 A1 Jul. 21, 2022

(30) Foreign Application Priority Data
May 28, 2019 (JP) .................................. 2019-099431

(51) Int. Cl.
*B65D 85/84* (2006.01)
*B65D 23/02* (2006.01)

(52) U.S. Cl.
CPC ............. *B65D 23/02* (2013.01); *B65D 85/84* (2013.01)

(58) Field of Classification Search
CPC .......... B65D 23/02; B65D 85/84; B65D 5/56; B65D 25/14; B65D 2581/00; B65D 65/38
USPC ...................... 206/524.1, 524.3, 524.4, 524.6
See application file for complete search history.

(56) References Cited

U.S. PATENT DOCUMENTS

| 8,590,705 B2 | 11/2013 | Behm et al. |
| 2013/0020335 A1 | 1/2013 | Schmidt et al. |
| 2014/0367300 A1 | 12/2014 | Petkus et al. |
| 2016/0349616 A1* | 12/2016 | Nakagawa .......... H01L 21/0332 |

(Continued)

FOREIGN PATENT DOCUMENTS

| CN | 102803560 A | 11/2012 |
| JP | 4-201854 A | 7/1992 |

(Continued)

OTHER PUBLICATIONS

International Search Report (PCT/ISA/210) issued in PCT Application No. PCT/JP2020/017308 dated Jul. 14, 2020 with English translation (six (6) pages).

(Continued)

*Primary Examiner* — Jacob K Ackun
(74) *Attorney, Agent, or Firm* — Crowell & Moring LLP

(57) ABSTRACT

The present disclosure provides a β-diketone storage container including: a metal storage container to which a liquid β-diketone is charged, the metal being an aluminum material; and an inorganic film on an inner surface of the storage container, the inorganic film containing at least one material selected from the group consisting of silicon dioxide, silicon carbonitride, silicon carbide, silicon nitride, diamond, and diamond-like carbon.

14 Claims, 1 Drawing Sheet

(56) References Cited

U.S. PATENT DOCUMENTS

| | | | |
|---|---|---|---|
| 2019/0304801 A1* | 10/2019 | Yamauchi | H01L 21/76892 |
| 2019/0348307 A1 | 11/2019 | Yamauchi et al. | |
| 2022/0282035 A1* | 9/2022 | Lee | G06F 3/044 |

FOREIGN PATENT DOCUMENTS

| | | |
|---|---|---|
| JP | 4-367441 A | 12/1992 |
| JP | 2006-176180 A | 7/2006 |
| JP | 2010-116616 A | 5/2010 |
| JP | 2017-190165 A | 10/2017 |
| JP | 6517994 B1 | 5/2019 |
| WO | WO 2018/128079 A1 | 7/2018 |

OTHER PUBLICATIONS

Japanese-language Written Opinion (PCT/ISA/237) issued in PCT Application No. PCT/JP2020/017308 dated Jul. 14, 2020 (three (3) pages).

* cited by examiner

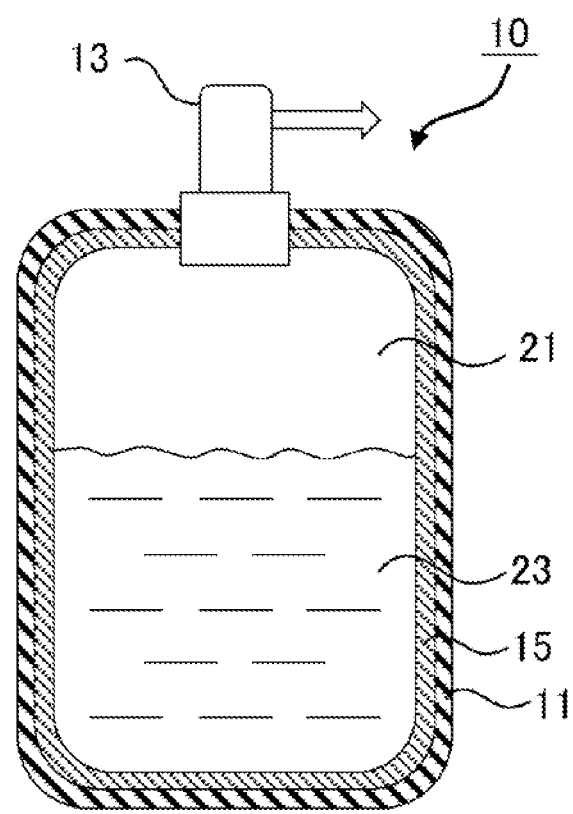

BETA-DIKETONE STORAGE CONTAINER AND PACKAGING METHOD

TECHNICAL FIELD

The present disclosure relates to a β-diketone storage container for use in a semiconductor manufacturing apparatus, for example.

BACKGROUND ART

β-diketones such as acetylacetone and hexafluoroacetylacetone (1,1,1,5,5,5-hexafluoro-2,4-pentanedione) easily react and form complexes with various kinds of metals. Thus, nowadays, use of β-diketones is expected in semiconductor manufacturing apparatuses, for example, for forming or etching semiconductor layers and metal layers and cleaning the inside of chambers. High-purity β-diketones are required for use in semiconductor manufacturing apparatuses because even a small amount of impurities therein can affect the product quality.

β-diketones, which are organic materials, are usually stored in durable resin or glass containers. However, metal containers are preferred for actual use of β-diketones in semiconductor manufacturing apparatuses in terms of containers' sealability, durability, and easy connection to pipes.

However, when a β-diketone is stored in a metal container, a metal constituting the container and the β-diketone form a complex, which causes dissolution of the metal into the β-diketone, thus increasing metal impurities in the β-diketone during storage.

Patent Literature 1 examines, as a chemical resistant metal container, a chemical container including a metal container (e.g., stainless steel container) and a film made of a chemically stable fluororesin, such as PFA, which is a copolymer of tetrafluoroethylene and perfluoroalkoxyethylene, on an inner surface of the container.

However, when a β-diketone is stored in the stainless steel container including the fluororesin film disclosed in Patent Literature 1, the β-diketone permeates the fluororesin and a part of the β-diketone reaches a surface of the metal. Thus, the container cannot prevent the dissolution of the metal component.

In Patent Literature 2, in order to sufficiently maintain the quality of resistivity or the like of a liquid to be stored (e.g., an organic material having a melting point of −70° C. to 30° C., such as a liquid crystal material), an inorganic film having a thickness of 10 nm to 1000 μm is formed on an inner surface of a container made of metal selected from iron, copper, corrosion resistant steel, aluminum, and titanium.

β-diketones easily form complexes with transition metals such as iron. Thus, materials containing transition metals such as stainless steel are not preferred as materials of β-diketone storage containers. This gives consideration to storage of β-diketones in containers made of aluminum materials that are less likely to form complexes with β-diketones.

In Patent Literature 3, since hexafluoroacetylacetone suffers from a decrease in purity immediately after introduction into an Al container, an Al—Mg alloy container, or an Al—Mg—Si alloy container for storage due to reaction and formation of a metal complex with a natural oxide film on an inner surface of the metal container, a washing step is provided to remove the natural oxide film in advance so as to prevent the decrease in purity.

CITATION LIST

Patent Literature

Patent Literature 1: JP H04-201854 A (JP 2882421 B)
Patent Literature 2: JP 2017-190165 A
Patent Literature 3: JP 2006-176180 A (JP 4460440 B)

SUMMARY OF INVENTION

Technical Problem

However, supply of a gaseous β-diketone to a semiconductor manufacturing apparatus requires heating of a β-diketone-containing container to a temperature that vaporizes a liquid β-diketone contained in the β-diketone-containing container. For example, hexafluoroacetylacetone has a normal boiling point of about 70° C., and when it is used in the form of gas, the storage container is required to be heated to at least 60° C., preferably to 80° C. Yet, as disclosed in Patent Literature 3, even use of an aluminum container with a natural oxide film removed could not prevent the dissolution of the metal component into the β-diketone when the container was continuously heated for a long time. In the case of supply of a gaseous β-diketone to a semiconductor manufacturing apparatus, a β-diketone-containing container may be heated only when the gaseous β-diketone is supplied or may be continuously heated even when the gaseous β-diketone is not supplied. Thus, it is desired to suppress the dissolution of metal components into a β-diketone even when β-diketone-containing containers are continuously heated for a long time.

The present disclosure aims to provide, for example, a β-diketone storage container, which can suppress an increase in metal impurities in a liquid β-diketone charged in the container and retained in a state where the liquid β-diketone is vaporizable.

Solution to Problem

As a result of extensive studies, the present inventors found that when a β-diketone is stored in an Al or Al alloy storage container including an inorganic film made of silicon dioxide ($SiO_2$), silicon carbonitride (SiCN), diamond-like carbon (DLC), or the like on its inner surface, it is possible to suppress an increase in metal impurities in the β-diketone even when the container is retained at high temperatures for a long time, and the present disclosure was thus accomplished.

Specifically, the present disclosure provides a β-diketone storage container including: a metal storage container to which a liquid β-diketone is charged, the metal being an aluminum material; and an inorganic film on an inner surface of the storage container, the inorganic film containing at least one material selected from the group consisting of silicon dioxide, silicon carbonitride, silicon carbide, silicon nitride, diamond, and diamond-like carbon.

Advantageous Effects of Invention

The present disclosure can provide, for example, a β-diketone storage container, which can suppress an increase in metal impurities in a liquid β-diketone charged in the container and retained in a state where the liquid β-diketone is vaporizable.

BRIEF DESCRIPTION OF DRAWINGS

FIG. 1 is a schematic cross-sectional view of a storage container according to one embodiment of the present disclosure.

DESCRIPTION OF EMBODIMENTS

Hereinafter, the present disclosure is described in detail. The following description of elements is intended to provide an example of an embodiment of the present disclosure, and the present disclosure is not limited to the specific contents of the description. Various modifications can be made within the scope of the gist.

β-diketone-Containing Container

FIG. 1 shows a β-diketone-containing container 10 of the present embodiment. The β-diketone-containing container 10 is obtained by charging a liquid β-diketone into a metal storage container 11. In the storage container 11, β-diketone is divided into a gas phase 21 and a liquid phase 23. The storage container 11 includes an outlet 13 through which a β-diketone can be charged and discharged, and a gaseous β-diketone in the gas phase 21 can be supplied therethrough. Such supply requires heating of the β-diketone-containing container 10 to compensate heat of vaporization of the β-diketone in the liquid phase 23.

Storage Container

In a preferred embodiment of the present disclosure, the metal storage container 11 is a container obtained by molding using an aluminum material, and includes an inorganic film 15 made of silicon dioxide ($SiO_2$), silicon carbonitride (SiCN), diamond-like carbon (DLC), or the like on its inner surface. In the present disclosure, the term "aluminum material" refers to pure aluminum and aluminum alloy defined in JIS H 4000:2014.

In a preferred embodiment of the present disclosure, the aluminum material may be pure aluminum having a purity of 99 mass % or higher, preferably 99.5 mass % or higher, with the balance being unavoidable impurities. For example, Al050 can be used. The aluminum alloy may be Al—Mg alloy having an Al content of 90 mass % or more and 99.9 mass % or less and a Mg content of 0.1 mass % or more and 10 mass % or less. For example, A5052 can be used. Alternatively, the aluminum alloy may be Al—Mg—Si alloy having an Al content of 94 mass % or more and 99.8 mass % or less, a Mg content of 0.1 mass % or more and 5 mass % or less, and a Si content of 0.1 mass % or more and 1 mass % or less. For example, A6061 can be used.

The storage container is heated to a normal boiling point (i.e., a boiling point at 1 atm) or higher of the β-diketone in use. The storage container may have any shape. Generally, the storage container can be what is called a cylinder having a cylindrical shape in which one end is closed and the other end includes an opening through which a liquid β-diketone can be charged and a gaseous β-diketone can be discharged. The opening can be provided with the outlet 13 through which a gaseous β-diketone can be supplied to the outside.

Preferably, the inorganic film has a thickness of 10 nm or more and 1000 μm or less. The thickness is more preferably 100 nm or more and 100 μm or less, still more preferably 500 nm or more and 50 μm or less.

Too thin an inorganic film may allow contact between the β-diketone and the metal due to a defect in the inorganic film or the like. Thus, preferably, the inorganic film has a thickness of 500 nm or more.

The storage container according to the present embodiment is obtained by producing a container using a plate made of an aluminum material and forming an inorganic film on its inner surface. An inorganic film is formed on the inner surface of the storage container by a method such as a physical vapor deposition (PVD) method (e.g., vacuum deposition or sputtering), a chemical vapor deposition (CVD) method, or a method that includes applying and baking a raw material solution.

The inorganic film contains at least one material selected from the group consisting of silicon dioxide ($SiO_2$), silicon carbonitride (SiCN), silicon carbide, silicon nitride, diamond, and diamond-like carbon (DLC). The inorganic film contains the material in an amount of preferably 99 mass % or more, more preferably 99.9 mass % or more. Particularly preferred is a high-purity inorganic film whose balance consists only of unavoidable impurities.

The inorganic film may be an amorphous hard film made of hydrocarbon or an allotrope of carbon.

Silicon carbonitride is a material represented by a chemical formula of $SiC_xN_y$ (x is 0.3 or more and 9 or less; and y is 0.3 or more and 9 or less).

Silicon carbide is a material represented by a chemical formula of SiC.

Silicon nitride is a material represented by a chemical formula of $SiN_x$ (x is 0.3 or more and 9 or less). Usually, it is $Si_3N_4$.

Diamond is a material having carbon atoms in a diamond cubic crystal structure. For example, a diamond thin film can be obtained by the CVD method.

The inorganic film may be an amorphous hard film made of hydrocarbon or an allotrope of carbon.

In particular, according to the present embodiment, preferably, the inorganic film includes at least one material selected from the group consisting of silicon dioxide, silicon carbonitride, and diamond-like carbon. More preferably, the inorganic film includes at least one material selected from the group consisting of silicon dioxide and silicon carbonitride.

The β-diketone is a compound in which two carbonyl groups are bonded to each other across one carbon atom. Specifically, it is preferably a compound represented by $R^1$—CO—$CR^3R^4$—CO—$R^2$ ($R^1$ and $R^2$ are C1-C10 hydrocarbon groups and each may include a heteroatom or a halogen atom; $R^3$ and $R^4$ are hydrogen atoms, halogen atoms, or hydrocarbon groups same as $R^1$ and $R^2$, examples of the heteroatom including nitrogen, oxygen, sulfur, phosphorus, chlorine, iodine, and bromine; $R^1$ to $R^4$ may be the same as or different from each other; and a hydrocarbon group having three of more carbon atoms may be one having a branched chain structure or one having a ring structure). Specifically, examples of the β-diketone include acetylacetone, hexafluoroacetylacetone, and trifluoroacetylacetone.

In particular, the β-diketone for use in the present embodiment preferably includes a fluorine atom in its chemical formula. Specifically, examples of the β-diketone include hexafluoroacetylacetone, trifluoroacetylacetone, 1,1,1,6,6,6-hexafluoro-2,4-hexanedione, 4,4,4-trifluoro-1-(2-thienyl)-1,3-butanedione, 4,4,4-trifluoro-1-phenyl-1,3-butanedione, 1,1,1,5,5,5-hexafluoro-3-methyl-2,4-pentanedione, 1,1,1,3,5,5,5-heptafluoro-2,4-pentanedione, and 1,1,1-trifluoro-5,5-dimethyl-2,4-hexanedione.

Charging Method

The β-diketone charging method according to the present embodiment includes a charging step of charging a liquid β-diketone into the storage container. The charging method of the present embodiment can provide the β-diketone-containing container of the present embodiment.

Preferably, the charging method of the present embodiment includes, prior to the charging step, a washing step of washing the inner surface of the storage container with a same β-diketone as the β-diketone that is charged in the charging step, at a temperature of 10° C. or higher. In the washing step, first, a liquid β-diketone is introduced into the container purged with an inert gas, and the container is sealed and retained at a constant temperature for a certain time. Here, any type of inert gas may be used. Preferably, the temperature range is 10° C. to 400° C. The temperature range is more preferably 20° C. to 200° C., still more preferably 40° C. to 120° C. The retention time may be suitably set, but is preferably one minute to one week, more preferably one hour to five days. Next, the liquid β-diketone inside the container is discarded, and the container is washed again with a liquid β-diketone and dried in an inert gas atmosphere. Here, any type of inert gas may be used under any conditions. Examples of the inert gas that can be used include nitrogen gas, argon gas, neon gas, helium gas, krypton gas, and xenon gas.

In the washing step, the temperature of the container containing the liquid β-diketone and sealed is preferably 80° C. or higher, more preferably 90° C. or higher, still more preferably 100° C. or higher.

β-diketone Supply Method

The β-diketone supply method according to the present embodiment includes a supplying step of supplying a gaseous β-diketone by heating the β-diketone-containing container obtained by the charging method to 60° C. or higher.

The heating temperature of the β-diketone-containing container in the supplying step may be 70° C. or higher, or 80° C. or higher. An increase in the temperature facilitates supply of a large amount of a gaseous β-diketone but is likely to cause the dissolution of the metal component. The heating time of the container is not limited. The container may be heated only when supply of a gaseous β-diketone is required, or the container may be continuously heated for a long time, for example, for one month or longer or one year or longer.

Preferably, the β-diketone in the β-diketone storage container according to the present embodiment shows an increase in the aluminum concentration in the liquid β-diketone of not more than 50 ppb by mass even when it is retained at 80° C. for one year. The increase is more preferably not more than 30 ppb by mass, still more preferably not more than 10 ppb by mass.

EXAMPLES

Hereinafter, the present disclosure is described in detail with reference to examples, but is not limited to these examples.

Examples 1 to 9 and Comparative Examples 1 to 3

An Al (A1050) container, an Al—Mg alloy (A5052) container, and an Al—Mg—Si alloy (A6061) container respectively including 1 μm thick inorganic films made of silicon dioxide ($SiO_2$), silicon carbonitride (SiCN), and diamond-like carbon (DLC) on their respective inner surfaces were prepared. Also, an Al (A1050) container, an Al—Mg alloy (A5052) container, and an Al—Mg—Si alloy (A6061) container not including inorganic films on their respective inner surfaces were prepared. The inorganic film made of $SiO_2$ was obtained by applying a raw material solution of silica and baking the raw material solution at 300° C. or higher. The inorganic film made of SiCN was obtained by the PVD method. The inorganic film made of DLC was obtained by the plasma CVD method. The amount of each material in the corresponding inorganic film was 99 mass % or more.

Next, the inside of the container was purged with nitrogen gas. A liquid β-diketone was introduced into the container, and the container was sealed and heated. The container was retained at 100° C. for four days, and the inside of the container was washed. The liquid β-diketone in the container was discarded, and the container was washed again with a liquid β-diketone and dried with nitrogen gas. The inside of the container was purged with nitrogen gas.

Into the container was charged, as a liquid β-diketone, hexafluoroacetylacetone in which the Al concentration and the Fe concentration were each 5 ppb by mass or less, and the container was sealed. Then, the container was heated to 80° C. was left to stand for one month or one year. The metal component in the liquid β-diketone in the container was analyzed before the test, one month after the test, and one year after the test, using inductively coupled plasma mass spectroscopy (ICP-MS). The nitrogen gas used in the examples and the comparative examples was nitrogen gas from which metal particles were removed using a filter.

Table 1 shows the results obtained by the above operation. According to Examples 1 to 6, the containers each including the inorganic film made of $SiO_2$ or SiCN on their inner surfaces showed no increase in the Al component one month after the test and one year after the test. In contrast, according to Comparative Examples 1 to 3, the liquid β-diketones in the containers without the inorganic films on their inner surfaces showed an increase in the Al component. According to Examples 7 to 9, the β-diketones in the containers each including the inorganic film made of DLC showed no increase in the Al component one month after the test, but showed an increase in the Al component one year after the test. Yet, the increase was small, compared to Comparative Examples 1 to 3

In Examples disclosed in Patent Literature 3, the Al concentration in hexafluoroacetylacetone remained the same even after retention at 30° C. for one week or two weeks. However, in Comparative Examples 1 to 3 each in which the storage method disclosed in Patent Literature 3 was replicated, the Al component increased due to the retention at a high temperature (80° C.) for a long time (one month or longer).

Example 10 and Comparative Example 4

A β-diketone storage test was performed as in Example 1 and Comparative Example 1, except that the temperature in the washing step was changed from 100° C. to 20° C.

Table 1 shows the results obtained by the above operation. A comparison between Example 10 and Comparative Example 4 shows that the presence of the inorganic film can suppress the increase in the Al component even when the washing was performed at 20° C. A comparison between Example 10 and Example 1 shows that the increase in the Al component was more suppressed in Example 1 in which the washing was performed at 100° C. before the β-diketone was charged than in Example 10 in which the washing was performed at 20° C.

Comparative Example 5

A β-diketone storage test was performed as in Example 1, except that a stainless steel (SUS304L) container including 1-μm thick PFA on its inner surface was used.

Table 1 shows the results obtained by the above operation. According to Comparative Example 5, the liquid β-diketone in the stainless steel container including PFA on its inner surface showed a significant increase in the Fe component. It is clear from Comparative Example 5 that the container disclosed in Patent Literature 1 cannot prevent the dissolution of the metal component.

Presumably, even if an inorganic film made of $SiO_2$ or the like was formed on the inner surface of the stainless steel container, the dissolution of the metal component derived from the stainless steel into the β-diketone would not be prevented.

The above results show that use of the metal container made of an aluminum material and including the inorganic film made of $SiO_2$, SiCN, or DLC on its inner surface can prevent an increase in the metal component in the liquid β-diketone during storage at high temperatures for a long time. Use of the metal container made of an aluminum material and including the inorganic film made of silicon carbide, silicon nitride, or diamond on its inner surface can also prevent an increase in the metal component in the liquid β-diketone during storage at high temperatures for a long time.

The present application claims priority to Japanese Patent Application No. 2019-099431 filed in Japan on May 28, 2019 under the Paris Convention and provisions of national law in a designated State. The entire contents of which are hereby incorporated by reference.

REFERENCE SIGNS LIST

10 β-diketone-containing container
11 storage container
13 outlet
15 inorganic film
21 gas phase
23 liquid phase

The invention claimed is:

1. A β-diketone storage container comprising:
a metal storage container to which a liquid β-diketone is charged, the metal being an aluminum material; and
an inorganic film on an inner surface of the storage container, the inorganic film containing at least one material selected from the group consisting of silicon dioxide, silicon carbonitride, silicon carbide, silicon nitride, diamond, and diamond-like carbon.

2. The β-diketone storage container according to claim 1, wherein the β-diketone includes a fluorine atom in its chemical formula.

3. The β-diketone storage container according to claim 1, wherein the aluminum material is pure aluminum, Al—Mg alloy, or Al—Mg—Si alloy.

4. The β-diketone storage container according to claim 1, wherein the inorganic film has a thickness of 10 nm or more and 1000 μm or less.

5. The β-diketone storage container according to claim 1, wherein the storage container is heated to a normal boiling point or higher of the β-diketone in use.

TABLE 1

| | | | | Before test | | After storage at 80° C. for one month | | After storage at 80° C. for one year |
|---|---|---|---|---|---|---|---|---|
| | Material of container | Film on inner surface | Washing temperature before storage | Al concentration [ppb by mass] | Fe concentration [ppb by mass] | Al concentration [ppb by mass] | Fe concentration [ppb by mass] | Al concentration [ppb by mass] |
| Example 1 | Al | $SiO_2$ 1 μm | 100° C. | <5 | — | <5 | — | <5 |
| Example 2 | Al—Mg alloy | $SiO_2$ 1 μm | 100° C. | <5 | — | <5 | — | <5 |
| Example 3 | Al—Mg—Si alloy | $SiO_2$ 1 μm | 100° C. | <5 | — | <5 | — | <5 |
| Example 4 | Al | SiCN 1 μm | 100° C. | <5 | — | <5 | — | <5 |
| Example 5 | Al—Mg alloy | SiCN 1 μm | 100° C. | <5 | — | <5 | — | <5 |
| Example 6 | Al—Mg—Si alloy | SiCN 1 μm | 100° C. | <5 | — | <5 | — | <5 |
| Example 7 | Al | DLC 1 μm | 100° C. | <5 | — | <5 | — | 15 |
| Example 8 | Al—Mg alloy | DLC 1 μm | 100° C. | <5 | — | <5 | — | 20 |
| Example 9 | Al—Mg—Si alloy | DLC 1 μm | 100° C. | <5 | — | <5 | — | 15 |
| Example 10 | Al | $SiO_2$ 1 μm | 20° C. | <5 | — | 10 | — | 10 |
| Comparative Example 1 | Al | None | 100° C. | <5 | — | 15 | — | 95 |
| Comparative Example 2 | Al—Mg alloy | None | 100° C. | <5 | — | 15 | — | 100 |
| Comparative Example 3 | Al—Mg—Si alloy | None | 100° C. | <5 | — | 10 | — | 90 |
| Comparative Example 4 | Al | None | 20° C. | <5 | — | 20 | — | 130 |
| Comparative Example 5 | SUS | PFA 1 μm | 100° C. | — | <5 | — | 300 | — |

6. The β-diketone storage container according to claim 1,
wherein the β-diketone is hexafluoroacetylacetone,
the inorganic film comprises at least one material selected from the group consisting of silicon dioxide, silicon carbonitride, and diamond-like carbon, and
the inorganic film has a thickness of 500 nm or more and 50 μm or less.

7. The β-diketone storage container according to claim 6,
wherein the inorganic film comprises at least one material selected from the group consisting of silicon dioxide and silicon carbonitride.

8. A β-diketone-containing container comprising:
a storage container according to claim 1; and
a liquid β-diketone charged in the storage container.

9. The β-diketone-containing container according to claim 8,
wherein an increase in the aluminum concentration in the β-diketone is not more than 50 ppb by mass even after retention at 80° C. for one year.

10. A β-diketone charging method comprising:
charging a liquid β-diketone into a storage container made of an aluminum material, the storage container comprising an inorganic film on an inner surface thereof, the inorganic film containing at least one material selected from the group consisting of silicon dioxide, silicon carbonitride, silicon carbide, silicon nitride, diamond, and diamond-like carbon.

11. The β-diketone charging method according to claim 10, further comprising, prior to the charging, washing the inner surface of the storage container with a same β-diketone as the β-diketone that is charged in the charging, at a temperature of 10° C. or higher.

12. The β-diketone charging method according to claim 11,
wherein the temperature in the washing step is 80° C. or higher.

13. A β-diketone supply method comprising:
supplying a gaseous β-diketone by heating a β-diketone-containing container to 60° C. or higher, the β-diketone-containing container obtained by the charging method according to claim 10.

14. The β-diketone supply method according to claim 13,
wherein in the supplying, the β-diketone-containing container is heated to 80° C. or higher.

* * * * *